United States Patent
Robinson et al.

(10) Patent No.: US 6,922,421 B2
(45) Date of Patent: Jul. 26, 2005

(54) CONTROL AND CALIBRATION OF LASER SYSTEMS

(75) Inventors: Michael A. Robinson, Fremont, CA (US); Gideon Z. Romm, Bronx, NY (US)

(73) Assignee: Agilent Technologies, Inc., Palo Alto, CA (US)

( * ) Notice: Subject to any disclaimer, the term of this patent is extended or adjusted under 35 U.S.C. 154(b) by 176 days.

(21) Appl. No.: 10/339,946

(22) Filed: Jan. 10, 2003

(65) Prior Publication Data

US 2004/0136420 A1 Jul. 15, 2004

(51) Int. Cl.[7] .............................. H01S 3/13; H01S 3/00
(52) U.S. Cl. .............................. 372/29.015; 372/38.02; 372/38.07
(58) Field of Search .................. 372/29.015, 38.02, 372/38.07, 29.01, 29.011, 29.02, 38.1, 38.01

(56) References Cited

U.S. PATENT DOCUMENTS

| | | | | |
|---|---|---|---|---|
| 4,369,525 A | * | 1/1983 | Breton et al. | 398/197 |
| 4,733,398 A | * | 3/1988 | Shibagaki et al. | 372/31 |
| 5,696,657 A | * | 12/1997 | Nourrcier et al. | 361/93.8 |
| 6,697,388 B1 | * | 2/2004 | Broutin et al. | 372/20 |
| 6,792,020 B2 | * | 9/2004 | Romm | 372/38.09 |
| 2002/0114363 A1 | * | 8/2002 | Everett | 372/33 |
| 2004/0051938 A1 | * | 3/2004 | Chan et al. | 359/337.1 |
| 2004/0114646 A1 | * | 6/2004 | Stewart et al. | 372/34 |
| 2004/0136421 A1 | * | 7/2004 | Robinson et al. | 372/38.02 |
| 2004/0136729 A1 | * | 7/2004 | Robinson et al. | 398/183 |

\* cited by examiner

*Primary Examiner*—Don Wong
*Assistant Examiner*—Leith A. Al-Nazer

(57) ABSTRACT

A method for controlling a laser includes determining an average component of a laser drive current and adjusting a modulation component of the drive current based on the average component and a threshold current signal at the present temperature. Determining the average component includes adjusting the drive current until an output power of the laser is approximately equal to a reference signal that varies according to temperature. The method further includes calibrating the threshold current signal, which includes adjusting the drive current until the laser output power is approximately equal to a second reference signal, and storing the drive current signal as the threshold current signal at the present temperature. The method further includes recalibrating the threshold current signal, which includes storing a difference between a new value and a stored value of the threshold current signal as an offset for other stored values of the threshold current signal.

28 Claims, 7 Drawing Sheets

US 6,922,421 B2

CONTROL AND CALIBRATION OF LASER SYSTEMS

FIELD OF INVENTION

This invention relates to control and calibration of lasers.

DESCRIPTION OF RELATED ART

Laser diodes are a common light source for optical transmitters. As the transmission rate of optical transmitter increases, the precision of the control of the laser diodes must also increase. The classic problems that plague laser diodes include (1) the variability of slope efficiency over temperature, between parts, and over time, (2) the variability of the threshold current over temperature, between parts, and over time, and (3) the balance between the need for speed and reliability for the amount of drive current. Thus, what are needed are a method and an apparatus that optimize the control of the laser diodes despite these difficulties.

SUMMARY

In accordance with one aspect of the invention, a method for controlling a laser includes determining an average component of a laser drive current and adjusting a modulation component of the drive current based on the average component and a threshold current signal at the present temperature.

In one embodiment of the invention, determining the average component includes adjusting the drive current until an output power of the laser is approximately equal to a reference signal that varies according to the temperature.

In one embodiment of the invention, the method further includes calibrating the threshold current signal, which includes adjusting the drive current until the laser output power is approximately equal to a second reference signal, and storing the drive current signal as the threshold current signal at the present temperature.

In one embodiment of the invention, the method further includes recalibrating the threshold current signal, which includes storing a difference between a new value and a stored value of the threshold current signal as an offset for other stored values of the threshold current signal.

DETAILED DESCRIPTION

Figure 1A:
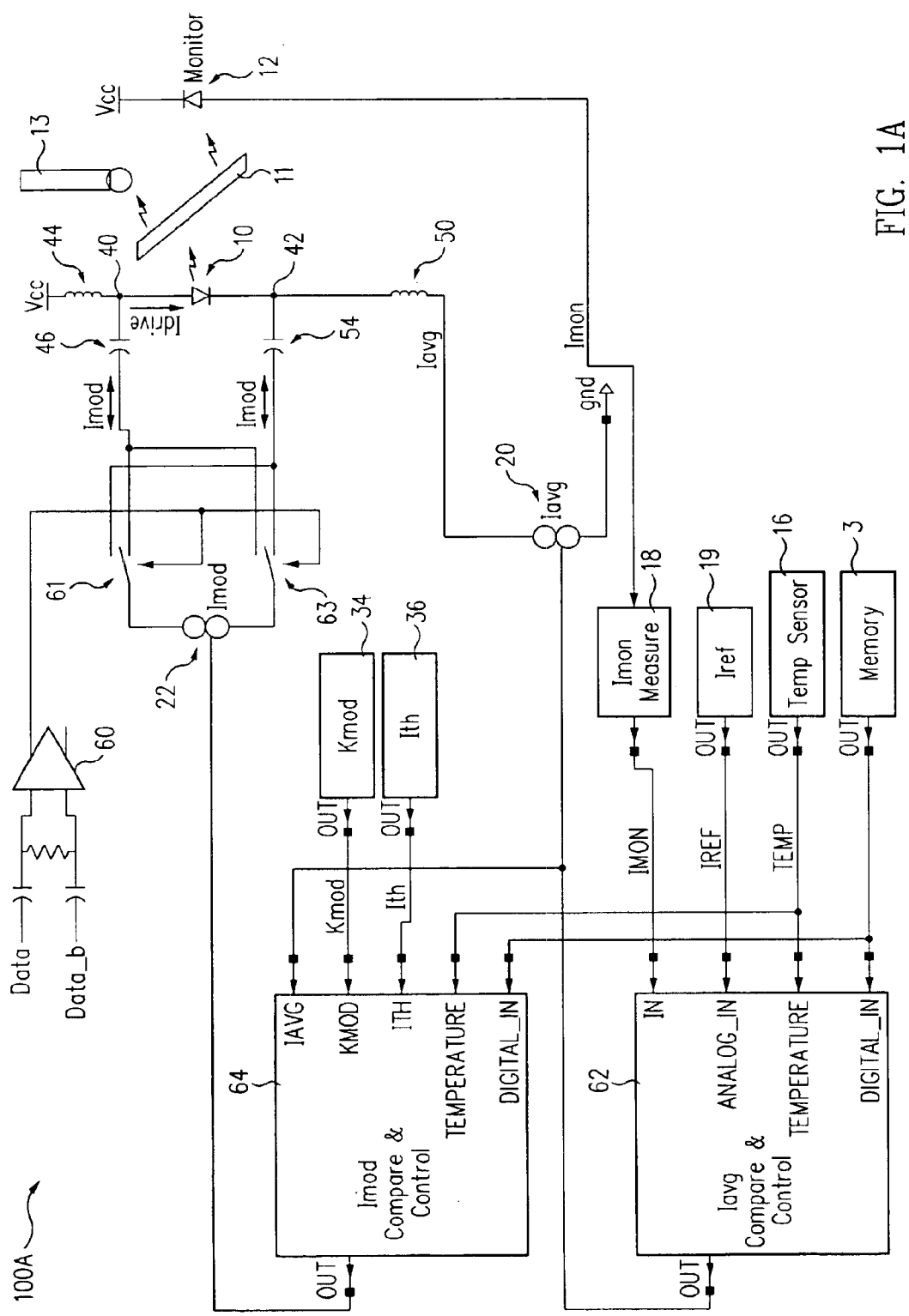
FIG. 1A is a schematic of a laser system in accordance with one embodiment of the invention.

FIG. 1A illustrates a laser system 100A in one embodiment of the invention. The anode of a laser 10 (e.g., a laser diode) is connected at a node 40 to a first terminal of an inductor 44. The second terminal of inductor 44 is connected to a supply rail that provides supply voltage Vcc to laser diode 10. The cathode of laser diode 10 is connected at a node 42 to a first terminal of an inductor 50. The second terminal of inductor 50 is connected to a current source 20 that sinks a current Iavg from laser diode 10. In operation, inductors 44 and 50 block alternating currents, and current source 20 provides current Iavg to laser diode 10. Current Iavg forms an average component of a drive current Idrive for laser diode 10. An Iavg control circuit 62 sets the value of current Iavg by outputting a gain signal to current source 20.

A differential amplifier 60 receives data signal Data and its complement Data_b. In response, amplifier 60 outputs a control signal to control terminals of switches 61 and 63. Switch 61 has a first terminal coupled to a first terminal of current source 22, a second terminal coupled to a first terminal of a capacitor 54, and a third terminal coupled to a first terminal of a capacitor 46. Switch 63 has a first terminal coupled to a second terminal of current source 22, a second terminal coupled to the first terminal of capacitor 46, and a third terminal coupled to the first terminal of capacitor 54. Depending on the control signal, switches 61 and 63 are configured so current source 22 either sources current Imod to capacitor 46 and sinks current Imod from capacitor 54, or sinks current Imod from capacitor 46 and sources current Imod to capacitor 54.

The second terminal of capacitor 46 is coupled to node 40 and the second terminal of capacitor 54 is coupled to node 42. Thus, current Imod is either added to node 40 and subtracted from node 42, or subtracted from node 40 and added to node 42. In operation, capacitors 46 and 54 block direct currents to laser diode 10, and current source 22 provides current Imod to laser diode 10. Current Imod forms a modulation component of drive current Idrive. Accordingly, drive current Idrive for laser diode 10 is either (Iavg+Imod) or (Iavg−Imod). An Imod control circuit 64 sets the value of current Imod by outputting a gain signal to current source 22.

A mirror 11 reflects a part of the light signal from laser diode 10 to a light detector 12 (e.g., a photodiode) and transmits a part of the light signal to a fiber 13 that carries the light signal to another component. Photodiode 12 is connected between supply rail Vcc and an Imon ADC (analog-to-digital converter) 18. Photodiode 12 outputs an analog signal Imon to Imon ADC 18. Analog signal Imon is proportional to the reflected power received by photodiode 12. The reflected power is proportional to the transmitted power received by fiber 13 and the total output power of laser diode 10. Imon ADC 18 outputs a digital signal IMON to control circuit 62.

A temperature sensor 16 outputs a signal TEMP to control circuits 62 and 64. Signal TEMP can be either digital or analog. Signal TEMP is proportional to the temperature of laser diode 10.

An Iref source 19 outputs a reference signal IREF to control circuit 62. Reference signal IREF can be either digital or analog. The values of reference signal IREF and signal IMON are typically compared in a feedback loop to control laser diode 10. Control circuit 62 can use signals IMON, TEMP, and IREF to determine the proper value for current Iavg in a method 200 (FIG. 2) described later.

A Kmod source 34 outputs a linearity coefficient signal Kmod to control circuit 64. Signal Kmod can be either digital or analog. An Ith source 36 outputs a threshold current signal Ith to control circuit 64. Signal Ith can be either digital or analog. Control circuit 64 can use signals Kmod and Ith to determine the proper value for current Imod in a method 300 (FIG. 3) described later.

A memory 3 outputs parameters for operating laser system 100A to control circuits 62 and 64. These parameters may include maximum and minimum values for current Iavg. Memory 3 may be a programmable nonvolatile memory such as an EEPROM.

Figure 1B:
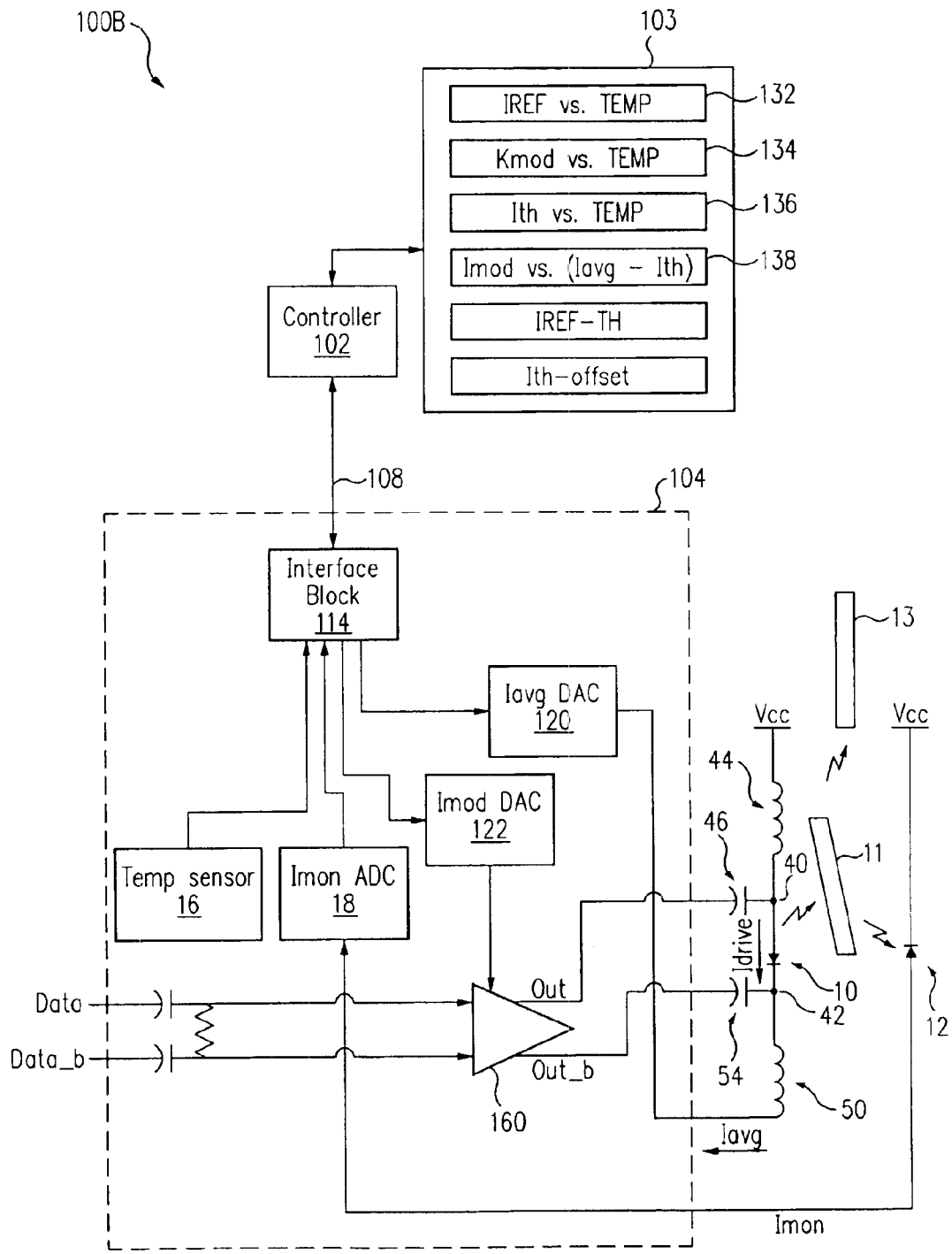
FIG. 1B is a schematic of a laser system in accordance with one embodiment of the invention.

FIG. 1B illustrates a laser system 100B in one embodiment of the invention. Same or similar elements in FIGS. 1A and 1B use the same reference numerals.

In FIG. 1B, the second terminal of inductor 50 is connected to an Iavg DAC (digital-to-analog converter) 120 in a driver circuit 104. Iavg DAC 120 sinks current Iavg from laser diode 10.

A differential amplifier 160 receives data signal Data and its complement Data_b. In response, amplifier 160 generates a signal Out to the first terminal of capacitor 46 and a complement Out_b to the first terminal of capacitor 54. As signals Out and Out_b are alternatively switched between high and low states by data signals Data and Data_b, capacitors 46 and 54 add or subtract current Imod to or from drive current Idrive. An Imod DAC 122 in driver circuit 104 controls the gain of differential amplifier 160 to set the value of current Imod.

In the present embodiment, a controller 102 implements control circuits 62 and 64 (FIG. 1A) to adjust the values of currents Iavg and Imod. A memory 103 implements IREF source 19, Kmod source 34, Ith source 36, and memory 3 (FIG. 1A). An interface block 114 in driver circuit 104 provides the interface between controller 102 and temperature sensor 16, Imon ADC 18, Iavg DAC 120, and Imod DAC 122. Controller 102 communicates with interface block 114 through a bus 108.

Iavg DAC 120 receives a control signal Iavg from controller 102 through interface block 114. Control signal Iavg sets the value of current Iavg.

Imod DAC 122 receives a control signal Imod from controller 102. Control signal Imod sets the gain for differential amplifier 160 that generates current Imod.

Figure 1C:
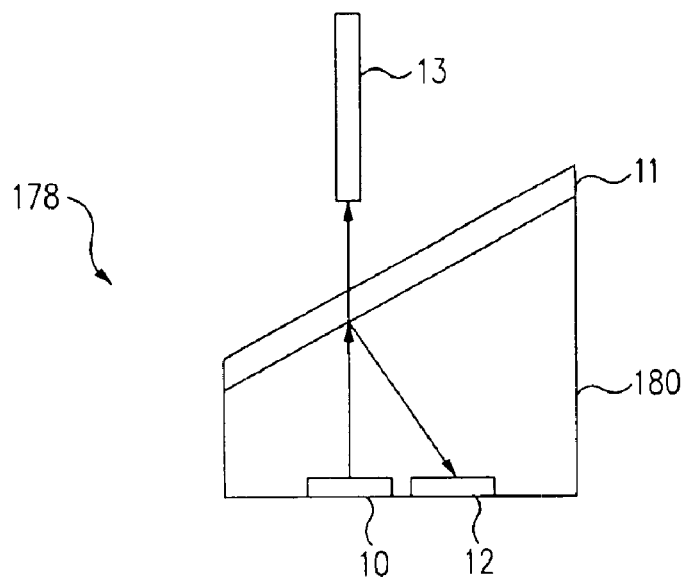
FIG. 1C is a cross-section of a laser subassembly for a laser system in one embodiment of the invention.
Figure 1D:
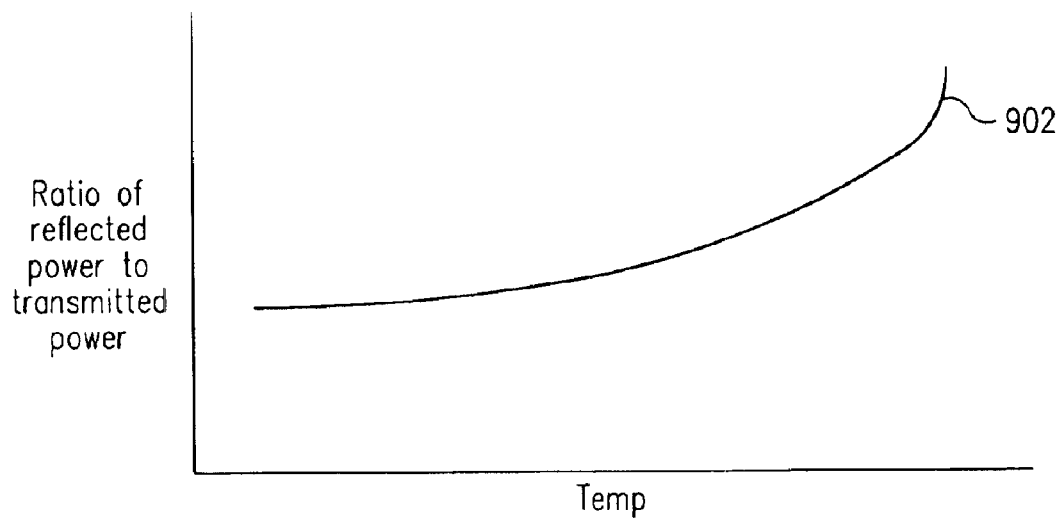
FIG. 1D illustrates a reflected-to-transmitted power ratio vs. temperature graph of a laser system in one embodiment of the invention.

FIG. 1C illustrates a configuration of a laser subassembly 178. Laser diode 10 and photodiode 12 are typically located inside a laser header 180 having an angled window mirror 11. Light emitted from laser diode 10 is partially transmitted through angled window mirror 11 to fiber 13 and partially reflected to photodiode 12. From experimental results, it is known that the ratio of reflected power detected by photodiode 12 to the transmitted power received by fiber 13 in laser system 100 varies over temperature. FIG. 1D illustrates an exemplary plot 902 of the ratio of reflected power to transmitted power over temperature for laser system 100. Thus, the variation of the reflected-to-transmitted power ratio should be compensated over temperature so the transmitted power received by fiber 13 remains constant over temperature.

In accordance with one aspect of the invention, controller 102 uses a reference signal IREF that varies over temperature to adjust current Iavg in a closed feedback loop. The variation of reference signal IREF over temperature offsets the variation of reflected power over temperature in order to keep the transmitted power received by fiber 13 constant.

Figure 2:
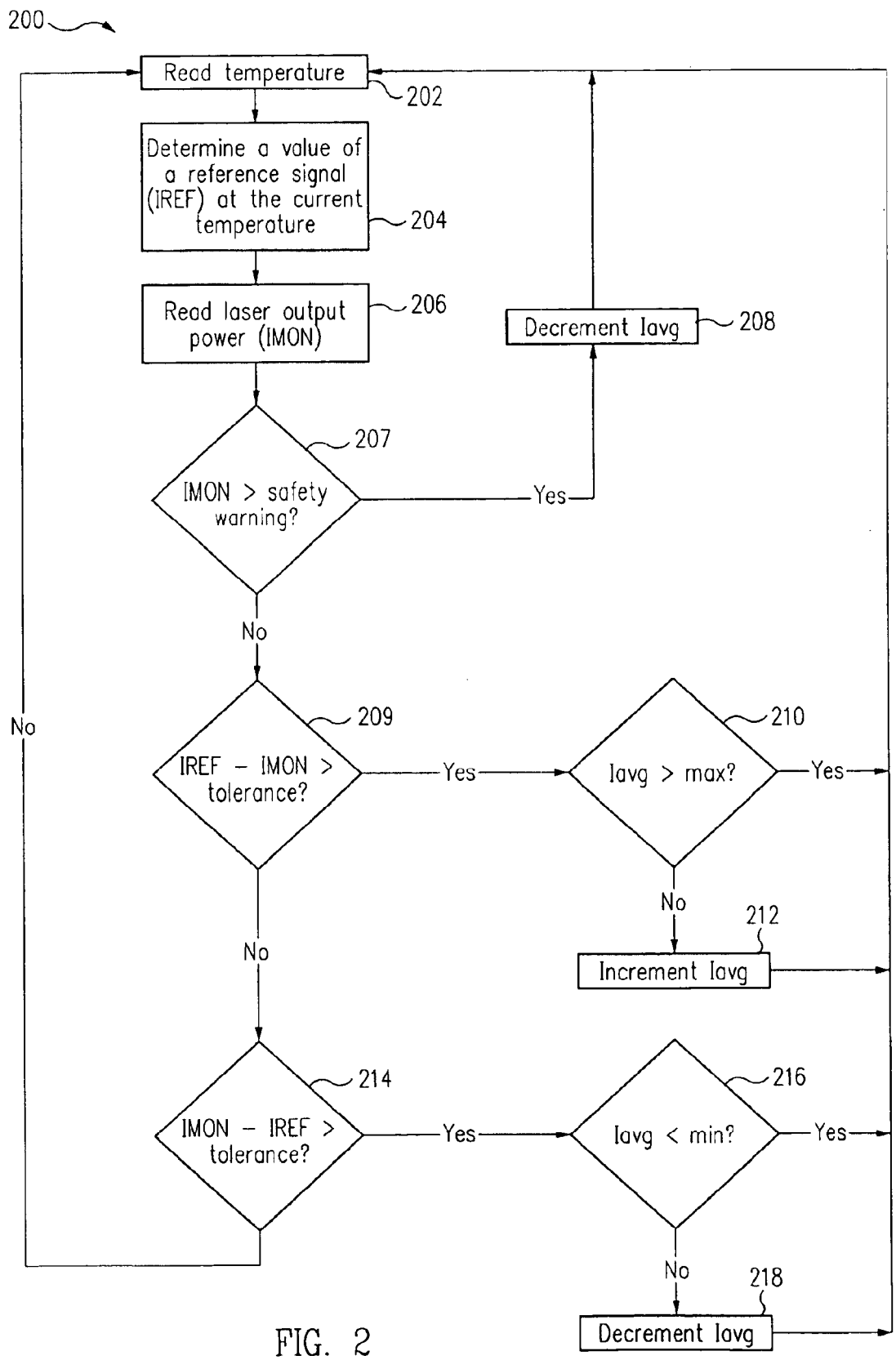
FIG. 2 illustrates a method for determining an average component of a current to the laser for generating a desired average power in one embodiment of the invention.

FIG. 2 is a flowchart of a method 200 implemented by controller 102 (FIG. 1B) to adjust the value of current Iavg in one embodiment of the invention. Alternatively, method 200 can also be implemented using control circuit 62 (FIG. 1A).

In step 202, controller 102 reads the temperature of laser diode 10 by requesting interface block 114 for the value of signal Temp from temperature sensor 16.

In step 204, controller 102 determines the value of reference signal IREF at the present temperature. Controller 102 may look up the value of reference signal IREF at the present temperature stored in a table 132 (FIG. 1B) in memory 103. The values of reference signal IREF can be determined from experimental data in which reference signal IREF is varied and the transmitted power received by fiber 13 is measured. Alternatively, controller 102 can calculate the value of reference signal IREF at the present temperature by using a function extrapolated from experimental data.

In step 206, controller 102 reads the reflected average power of laser diode 10 by requesting from interface block 114 the value of signal IMON from Imon ADC 18.

In step 207, controller 102 determines if signal IMON is greater than a safety warning. This ensures that laser diode 10 does not generate a level of light that is harmful to human operators. If signal IMON is greater than the safety warning, step 207 is followed by step 208. Otherwise step 207 is followed by step 209.

In step 208, controller 102 decrements current Iavg. Step 208 is followed by step 202 and method 200 is repeated.

In steps 209 to 218, controller 102 adjusts current Iavg until the value of signal IMON is approximately equal to the value of reference signal IREF. When this occurs, the reflected power of laser diode 10 is approximately equal to a desired value that indicates laser diode is generating a consistent transmitted average power to fiber 13.

In step 209, controller 102 determines if the value of reference signal IREF is greater than the value of signal IMON by a predetermined tolerance. If so, the reflected power of laser diode 10 is unacceptably smaller than its desired value, and step 209 is followed by step 210. If the value of reference signal IREF is not greater than the value of signal IMON by a predetermined tolerance, step 209 is followed by step 214.

In step 210, controller 102 determines if the value of current Iavg is greater than a maximum value. The maximum value is a function of the temperature of laser diode 10 and can be stored in memory 3. The maximum value ensures that drive current Idrive is not too high as to make laser diode 10 unreliable. Controller 102 can read the value of current Iavg from memory 103. Alternatively, controller 102 can read the value of current Iavg by requesting from interface block 114 the value of control signal Iavg from Iavg DAC 120. If the value of current Iavg is greater than a maximum value, step 210 is followed by step 202 so that current Iavg is not incremented, and method 200 is repeated in a feedback loop. Otherwise step 210 is followed by step 212.

In step 212, controller 102 increments current Iavg by instructing interface block 114 to increment the value of control signal Iavg to Iavg DAC 120. Iavg DAC 120 then increments current Iavg. Step 212 is followed by step 202 and method 200 is repeated in a feedback loop.

In step 214, controller 102 determines if the value of signal IMON is greater than the value of reference signal IREF by the predetermined tolerance. If so, the reflected power of laser diode 10 is unacceptably greater than the desired value, and step 214 is followed by step 216. If the value of signal IMON is not greater than the value of reference signal IREF by the predetermined tolerance, then step 214 is followed by step 202 and method 200 is repeated in a feedback loop.

In step 216, controller 102 determines if the value of current Iavg is less than a minimum value. The minimum value is a function of the temperature of laser diode 10 and can be stored in memory 3. The minimum value ensures that the laser output maintains a minimum edge speed. If the value of current Iavg is less than a predetermined minimum, step 216 is followed by step 202 so that current Iavg is not decremented, and method 200 is repeated in a feedback loop. Otherwise step 216 is followed by step 218.

In step 218, controller 102 decrements the value of current Iavg by instructing interface block 114 to decrement the value of control signal Iavg to Iavg DAC 120. Iavg DAC 120 then decrements the value of current Iavg. Step 218 is followed by step 202 and method 200 is repeated in a feedback loop.

In accordance with another aspect of the invention, controller 102 uses the values of the temperature of laser diode 10 and current Iavg to adjust the value of current Imod in an open-loop scheme based on the following formula:

$$Imod=Kmod*(Iavg-Ith) \quad (1)$$

Figure 2A:
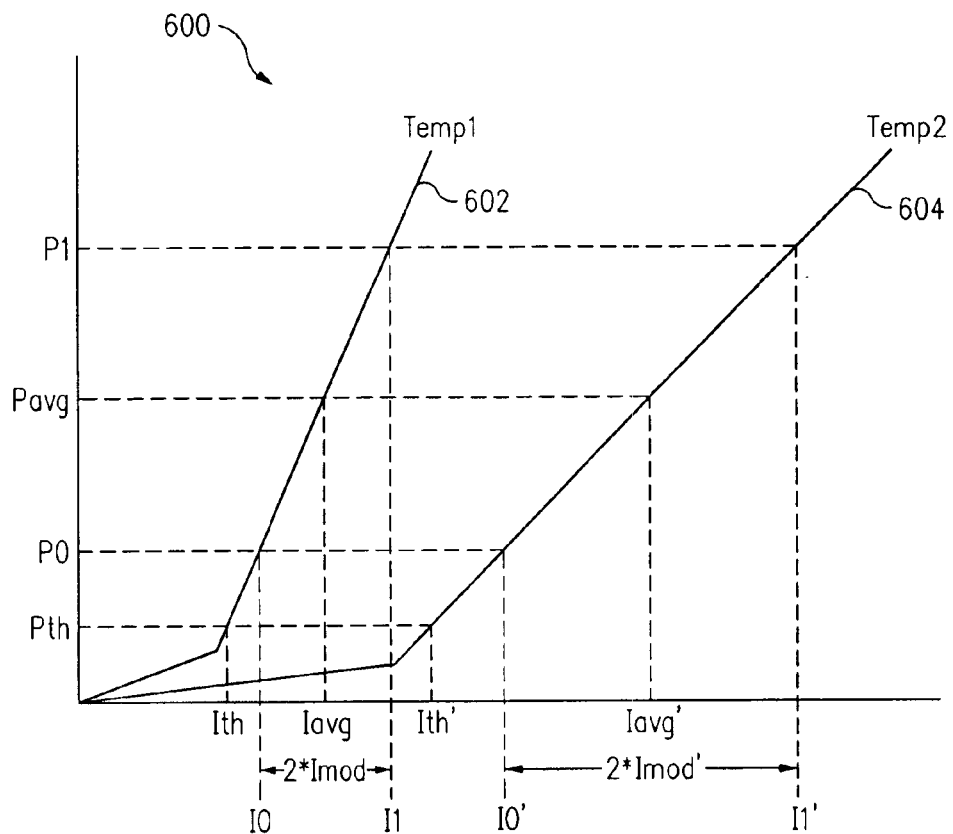
FIG. 2A is an LOP (luminous output power) vs. current graph of a laser diode in one embodiment of the invention.

Kmod is a linearity coefficient for laser diode 10 that depends on the temperature, and Ith is the threshold current of laser diode 10 that also depends on the temperature. Formula 1 is based on the relationship between the power, the drive current, and the temperature of laser diode 10 as shown in an exemplary graph 600 in FIG. 2A.

Graph 600 shows a plot 602 of LOP vs. drive current of laser diode 10 at a temperature Temp1. The vertical axis of graph 600 identifies a power Pth that is a predetermined reflected power representing a minimum threshold, a power P0 that is a predetermined reflected power representing a first logical state (e.g., a logical "0"), a power P1 that is a predetermined reflected power representing a second logical state (e.g., a logical "1"), and a power Pavg that is the average of reflected powers P0 and P1.

Power Pth is selected at a point where the reflected power is stable and linear. Power P0 is typically selected to be approximately 10% greater than power Pth. Power P1 is typically selected to produce an extinction ratio of P1/P0 of approximately 7 to 13. Such an extinction ratio provides the proper edge speed and reliable data recovery.

For plot 602, the horizontal axis of graph 600 identifies a current Ith (e.g., 2 milliamps) that produces power Pth, a current I0 (e.g., 2.3 milliamps) that produces power P0, a current I1 (e.g., 7.7 milliamps) that produces power P1, and current Iavg (e.g., 5 milliamps) that produces power Pavg. The difference between I1 and I0 (e.g., 5.4 milliamps) is twice the current Imod (e.g., 2.7 milliamps).

As plot 602 is linear between currents Ith and I1, current Imod can be made a fraction of the difference between currents Iavg and Ith where that fraction depends on the slope of plot 602. That fraction is represented by linearity coefficient Kmod in formula 1 for temperature Temp1. Coefficient Kmod can be determined for a range of temperatures by plotting LOP vs. drive current of laser diode 10 at these temperatures. For each plot, coefficient Kmod at the temperature of the plot is determined by using formula 1 from the values of currents Iavg, Ith, and Imod. With our exemplary values described above, Kmod for temperature Temp1 is calculated as follows:

$$Kmod=Imod/(Iavg-Ith)=2.7/(5-2)=0.9 \quad (2)$$

Graph 600 also shows a plot 604 of LOP vs. current of laser diode 10 at temperature Temp2. The horizontal axis of graph 600 identifies a current Ith' that produces power Pth, a current I0" that produces power P0, a current I1' that produces power P1, and a current Iavg' that produces power Pavg. The difference between currents I1' and I0' is twice the current Imod'. Coefficient Kmod at temperature Temp2 can be determined by using formula 2 from the values of currents Iavg', Ith', and Imod'.

Figure 3:
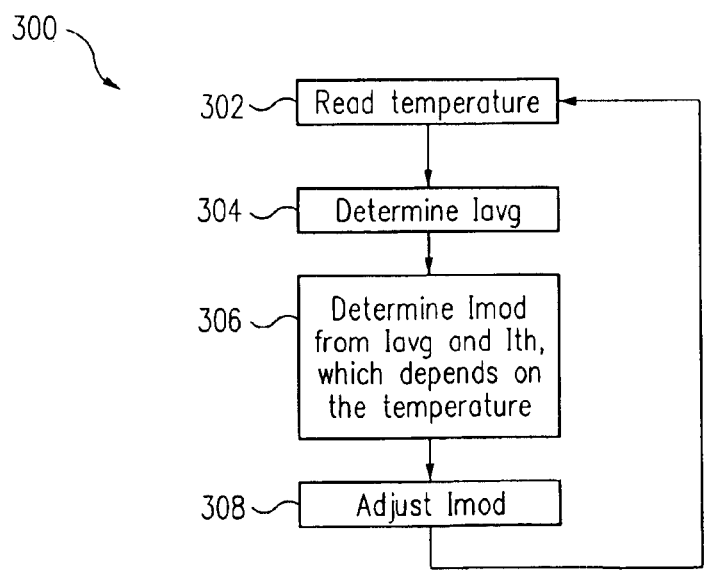
FIG. 3 illustrates a method for determining a modulation component of a current to the laser for generating desired modulated powers in one embodiment of the invention.

FIG. 3 is a flowchart of a method 300 for controller 102 (FIG. 1B) to adjust the value of current Imod using formula 1 in one embodiment of the invention. Alternatively, method 300 can also be implemented using control circuit 64 (FIG. 1A).

In step 302, controller 102 reads the temperature of laser diode 10.

In step 304, controller 102 determines the value of current Iavg. In the present embodiment, controller 102 uses method 200 described above to determine the value of current Iavg.

In step 306, controller 102 determines the value of current Imod from the values of currents Iavg and Ith using the relationship described by formula 1. Current Ith is a function of the temperature of laser diode 10.

In one embodiment of step 306, controller 102 determines the values of coefficient Kmod and threshold current Ith at the current temperature by looking up their values in respective tables 134 and 136 in memory 103. Controller 102 then calculates the value of current Imod from the values of current Iavg, coefficient Kmod, and threshold current Ith using formula 1.

In another embodiment of step 306, the values of threshold current Ith and current Imod are stored in respective tables 136 and 138 in memory 103 (FIG. 1B). Controller 102 first looks up threshold current Ith at the current temperature in table 136. Controller 102 then calculates the difference between the values of current Iavg and threshold current Ith at the current temperature. Controller 102 finally uses the difference to look up the value of current Imod in table 138.

In step 308, controller 102 adjusts current Imod by instructing interface block 114 to set the value of signal Imod to Imod DAC 122. Imod DAC 122 then adjusts the gain of amplifier 160 to increment or decrement current Imod to its desired value. Step 308 is followed by step 302 and method 300 repeats in an open loop.

Figure 4:
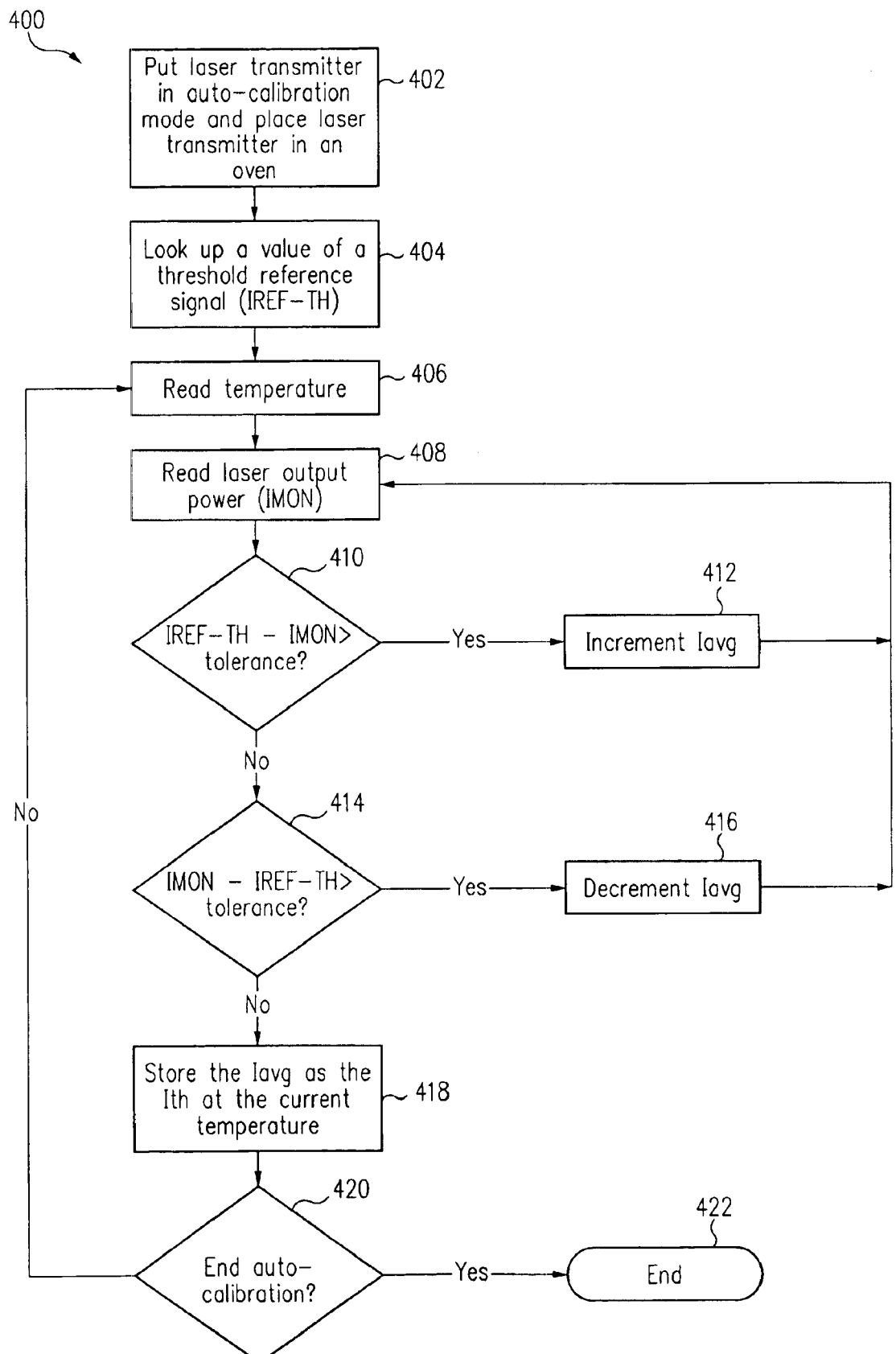
FIG. 4 illustrates a method for automatically calibrating the values of a threshold current for a range of temperatures in one embodiment of the invention.

In method 300, threshold current Ith plays an important role. Thus, the calibration of this parameter over a range of temperatures should be carefully accomplished. FIG. 4 is a flowchart of a method 400 for controller 102 to calibrate threshold current Ith over a range of temperatures without human intervention in one embodiment of the invention. Alternatively, method 400 can also be implemented using control circuit 62.

In step 402, laser system 100 is put into an auto-calibration mode. In the auto-calibration mode, controller 102 turns off current Imod. Laser system 100 is placed into an oven. The oven is then slowly heated and cooled over the range of operating temperatures of laser system 100.

In step 404, controller 102 determines the value of a reference signal IREF-TH for a threshold reflected power Pth of laser diode 10. Controller 102 may look up the value of reference signal IREF-TH in memory 103.

In step 406, controller 102 reads the temperature of laser diode 10.

In steps 408 to 416, controller 102 adjusts the value of current Iavg until the value of signal IMON is approximately equal to the value of reference signal IREF-TH. When this occurs, the reflected power of laser diode 10 is approximately equal to a desired value that indicates laser diode 10 is generating a desired power Pth.

In step 408, controller 102 reads the reflected power of laser diode 10.

In step 410, controller 102 determines if the value of reference signal IREF-TH is greater than the value of signal IMON by a predetermined tolerance. If so, the reflected power of laser diode 10 is unacceptably smaller than the desired power Pth of laser diode 10, and step 410 is followed by step 412. If the value of reference signal IREF-TH is not greater than the value of signal IMON by the predetermined tolerance, then step 410 is followed by step 414.

In step 412, controller 102 increments current Iavg. Step 412 is followed by step 408.

In step 414, controller 102 determines if the value of signal IMON is greater than the value of reference signal IREF-TH by the predetermined tolerance. If so, the reflected power of laser diode 10 is unacceptably greater than the desired power Pth of laser diode 10, and step 414 is followed by step 416. If the value of signal IMON is not greater than the value of reference signal IREF-TH by the predetermined tolerance, then step 414 is followed by step 418.

In step 416, controller 102 decrements the value of current Iavg. Step 416 is followed by step 408.

In step 418, the reflected power of laser diode 10 is approximately equal to the desired power Pth. Thus, controller 102 stores the value of current Iavg as the value of threshold current Ith at the present temperature in table 136. Step 418 is followed by step 420.

In step 420, controller 102 determines if the end of auto-calibration mode has been reached. The end of the auto-calibration mode has been reached when a specific operating temperature of laser system 100 has been reached or instructed by an external command signal. If so, step 420 is followed by the end of method 400 in step 422. If the end of the auto-calibration mode has not been reached, then step 420 is followed by step 406 and method 400 is repeated to determine the value of threshold current Ith at another temperature.

Figure 4A:
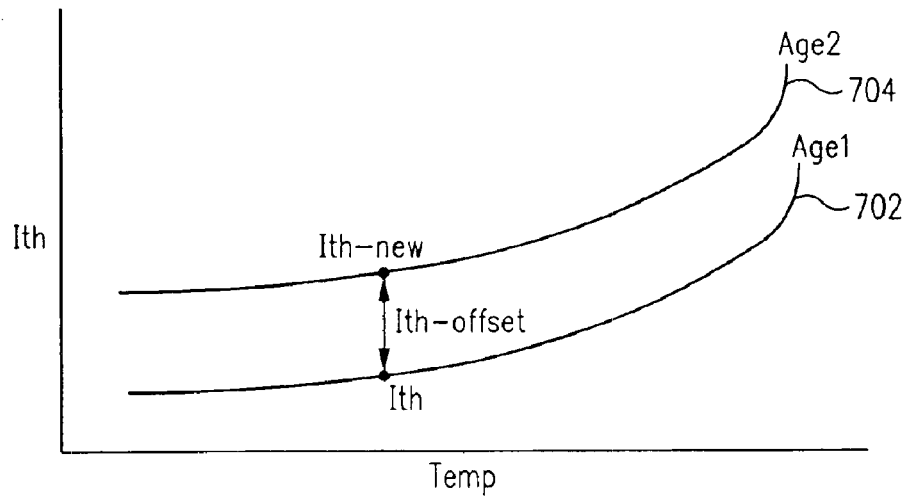
FIG. 4A is a threshold current vs. temperature graph of a laser diode in one embodiment of the invention.

FIG. 4A shows that over time, a plot 702 of threshold current Ith vs. temperature for laser diode 10 can shift to a plot 704. The shift can be generally described by an offset Ith-offset. Thus, the threshold current Ith should be recalibrated over time as laser system 100 ages to account for the shift of threshold Ith vs. temperature.

Figure 5:
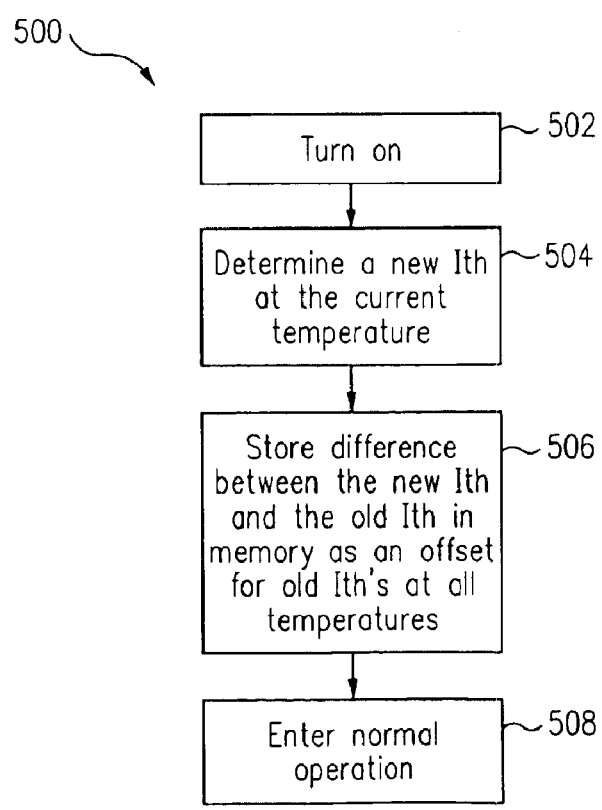
FIG. 5 illustrates a method for recalibrating the values of a threshold current for a range of temperatures in one embodiment of the invention.

FIG. 5 is a flowchart of a method 500 for controller 102 (FIG. 1B) to recalibrate threshold current Ith each time laser system 100 is turned on or instructed by an external command signal in one embodiment of the invention. Alternatively, method 500 can also be implemented using control circuit 62 (FIG. 1A).

In step 502, controller 102 puts laser system 100 into a recalibration mode where current Imod is turned off. Controller 102 does so when laser system 100 is turned on or when instructed by an external command signal.

In step 504, controller 102 determines a threshold current Ith-new at the current temperature. In the present embodiment, controller 102 uses method 400 described above to determine threshold current Ith-new for the current temperature.

In step 506, controller 102 calculates a difference between the values of threshold current Ith-new and the threshold current Ith stored in table 136 for the present temperature. Controller 102 stores difference Ith-offset in memory 103 as an offset for all the values of threshold current Ith stored in table 136.

In step 508, controller 102 puts laser transmitter 100 into a normal operation mode. During normal operation mode, controller 102 can adjust current Iavg and current Imod as described in methods 200 and 300 above with the exception that difference Ith-offset is added to all the values of Ith that are looked up from table 136.

Various other adaptations and combinations of features of the embodiments disclosed are within the scope of the invention. Numerous embodiments are encompassed by the following claims.

What is claimed is:

1. A method for a laser system to control a laser, comprising:
   generating a temperature signal corresponding to a temperature of the laser;
   generating a first control signal for a first component of a drive current to the laser, and
   generating a second control signal for a second component of the drive current, wherein the second control signal is based on the first control signal and a threshold current signal, and the threshold current signal is based on the temperature signal.

2. The method of claim 1, wherein the first component is an average component of the drive current and the second component is a modulation component of the drive current.

3. The method of claim 1, wherein said generating a second control signal comprises calculating the second component using the following formula:

$$Imod = Kmod*(Iavg - Ith),$$

where Imod is the second control signal, Kmod is a linearity coefficient signal at the temperature, Iavg is the first control signal, and Ith is the threshold current signal of the laser at the temperature.

4. The method of claim 3, further comprising determining the linearity coefficient signal and the threshold current signal based on the temperature signal.

5. The method of claim 4, wherein said determining the linearity coefficient signal and the threshold current signal comprises a step selected from the group consisting of looking up the linearity coefficient signal and the threshold current signal based on the temperature signal and calculating the linearity coefficient signal and the threshold current signal based on the temperature signal.

6. The method of claim 1, wherein said generating a second control signal comprises:
   determining the threshold current signal based on the temperature signal;
   determining a difference between the first control signal and the threshold current signal; and
   determining the second control signal based on the difference.

7. The method of claim 6, wherein said determining the threshold current signal comprises a step selected from the group consisting of looking up the threshold current signal based on the temperature signal and calculating the threshold current signal based on the temperature signal, and said determining the second control signal comprises a step selected from the group consisting of looking up the second control signal based on the difference and calculating the second control signal based on the difference.

8. The method of claim 1, wherein said generating a first control signal comprises:
   determining a reference signal based on the temperature signal;
   optically detecting a light output power of the laser;
   generating a power signal corresponding to the light output power detected;
   determining a difference between the reference signal and the power signal; and
   from the difference, adjusting the first control signal.

9. The method of claim 8, wherein said determining a reference signal comprises a step selected from the group consisting of looking up the reference signal based on the temperature signal and calculating the reference signal based on the temperature signal.

10. The method of claim 8, wherein said adjusting the first control signal comprises:
   if the reference signal is greater than the power signal and the first control signal is less than a maximum value, incrementing the first control signal; and
   if the power signal is greater than the reference signal and the first control signal is greater than a minimum value, decrementing the first control signal.

11. The method of claim 1, further comprising calibrating the threshold current signal, said calibrating comprising;
   generating the temperature signal corresponding to a second temperature of the laser;
   determining a reference signal for a threshold current of the laser;
   optically detecting a light output power of the laser;
   generating a power signal corresponding to the light output power detected;
   adjusting the first control signal until the power signal is approximately equal to the reference signal; and
   storing the temperature signal and the first control signal in a memory of the laser system, wherein the first control signal is the threshold current signal at the second temperature and said storing comprises a step selected from the group consisting of storing the temperature signal and the first control signal as a table and storing the temperature signal and the first control signal as a function.

12. The method of claim 11, wherein said determining a reference signal comprises a step selected from the group consisting of looking up the reference signal based on the temperature signal and calculating the reference signal based on the temperature signal.

13. The method of claim 11, prior to said calibrating further comprising:
   put the laser system in an automatic calibration mode;
   putting the laser system in an oven; and
   changing a third temperature inside the oven.

14. The method of claim 11, subsequent to said calibrating and prior to said generating a second control signal, further comprising recalibrating the threshold current signal, said recalibrating comprising:
   determining a new value of the threshold current signal based on the temperature signal;
   determining a stored value of the threshold current signal in the memory based on the temperature signal;
   determining a difference between the new and the stored values; and
   storing the difference in the memory as an offset for a plurality of stored values of the threshold current signal at other temperatures.

15. The method of claim 14, wherein said determining a new value of the threshold current signal comprises:
   adjusting the first control signal until the power signal is approximately equal to the reference signal, wherein a value of the first control signal is the new value of the threshold current signal.

16. The method of claim 15, wherein said determining a new value of the threshold current signal further comprises sensing the laser is turned on.

17. The method of claim 15, wherein said determining a stored value of the threshold current signal comprises a step selected from the group consisting of looking up the stored value based on the temperature signal and calculating the stored value based on the temperature signal.

18. The method of claim 14, wherein said generating a second control signal comprises:
   determining a second stored value of the threshold current signal based on the temperature signal; and
   adding the offset to the second stored value.

19. The method of claim 1, wherein the first and the second control signals are digital control signals.

20. A laser system, comprising:
   a memory, the memory storing a plurality of values of a threshold current signal for a plurality values of a temperature signal in a manner selected from the group consisting of a table and a function;
   a controller, the controller being coupled to receive the temperature signal from a temperature sensor and the threshold current signal from the memory based on the temperature signal, the controller further being coupled to send a first control signal to a first laser driver and a second control signal to a second laser driver, the first and the second laser drivers providing a drive current to a laser;
   wherein the controller adjusts the second control signal based on the first control signal and the threshold current signal.

21. The system of claim 20, wherein the first laser driver provides an average component of the drive current and the second laser driver providing a modulation component of the drive current.

22. The system of claim 20, wherein the controller adjusts the second control signal using the following formula:

$$Imod = Kmod*(Iavg-Ith),$$

where Imod is the second controls signal, Kmod is the linearity coefficient signal based on the temperature signal, Iavg is the first control signal, and Ith is the threshold current signal based on the temperature signal.

23. The system of claim 22, wherein the memory further stores a plurality of values of the linearity coefficient signal based on the plurality of values of the temperature signal.

24. The system of claim 22, wherein the memory further stores a plurality of values of the second control signal based on a difference between the first control signal and the threshold current signal.

25. The system of claim 20, wherein the memory further stores a plurality of values of a reference signal for the plurality of values of the temperature signal in a manner selected from the group consisting of a table and a function, the controller being coupled to receive a power signal from a light sensor, the controller further being coupled to receive the reference signal from the memory based on the temperature signal, the controller adjusting the first control signal based on a difference between the reference signal and the power signal.

26. The system of claim 20, wherein the memory further stores a threshold reference signal for a threshold output signal of the laser.

27. The system of claim 26, wherein the memory further stores an offset to be added to the stored values of the threshold current signal, the controller adding the offset to a stored value of the threshold current signal to get a new value of the threshold current signal.

28. The system of claim 20, wherein the first and the second control signals are digital control signals.

* * * * *